(12) United States Patent
Kim

(10) Patent No.: US 8,084,817 B2
(45) Date of Patent: Dec. 27, 2011

(54) SEMICONDUCTOR DEVICE AND METHOD FOR FABRICATING THE SAME

(75) Inventor: Mi-Young Kim, Gwanak-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 137 days.

(21) Appl. No.: 12/647,506

(22) Filed: Dec. 27, 2009

(65) Prior Publication Data
US 2010/0163992 A1 Jul. 1, 2010

(30) Foreign Application Priority Data
Dec. 31, 2008 (KR) .................. 10-2008-0138101

(51) Int. Cl.
*H01L 29/78* (2006.01)
*H01L 21/336* (2006.01)
(52) U.S. Cl. . 257/343; 257/330; 257/335; 257/E29.256; 257/E29.261; 257/E21.417
(58) Field of Classification Search .......... 257/330–360, 257/E29.256, E21.417
See application file for complete search history.

(56) References Cited

U.S. PATENT DOCUMENTS

| | | | |
|---|---|---|---|
| 2001/0023961 A1* | 9/2001 | Hshieh et al. | 257/330 |
| 2005/0082610 A1* | 4/2005 | Shibib et al. | 257/335 |
| 2008/0251863 A1* | 10/2008 | Huang et al. | 257/409 |
| 2009/0283825 A1* | 11/2009 | Wang et al. | 257/335 |
| 2010/0102388 A1* | 4/2010 | Levin et al. | 257/343 |
| 2011/0024836 A1* | 2/2011 | Zinn | 257/336 |

* cited by examiner

*Primary Examiner* — N Drew Richards
*Assistant Examiner* — Mamadou Diallo
(74) *Attorney, Agent, or Firm* — Sherr & Vaughn, PLLC

(57) ABSTRACT

A semiconductor device includes a high voltage first conduction type well in a semiconductor substrate, a second conduction type body in the high voltage first conduction type well, a source region in the second conduction type body, a trench in the high voltage first conduction type well, a first isolation oxide, an impurity doped polysilicon film, and a second isolation oxide stacked in the trench in succession, a drain region in the high voltage first conduction type well on one side of the trench, and a polygate on and/or over the high voltage first conduction type well.

20 Claims, 4 Drawing Sheets

SEMICONDUCTOR DEVICE AND METHOD FOR FABRICATING THE SAME

The present application claims priority under 35 U.S.C. §119 to Korean Patent Application No. 10-2008-0138101 (filed on Dec. 31, 2008), which is hereby incorporated by reference in its entirety.

BACKGROUND

As a power semiconductor device, a device is desirable that is operable at a high voltage close to a theoretical breakdown voltage of semiconductor. Therefore, if an integrated circuit controls an external system which uses a high voltage, the integrated circuit requires a semiconductor device built therein for controlling the high voltage, and the high voltage semiconductor device is required to have a structure which has a high breakdown voltage. Meaning, in a case of a drain or a source of a transistor having the high voltage applied thereto, it is required that a punch through voltage between the drain and source and a semiconductor substrate and the breakdown voltage between the drain and source and a well or the substrate is higher than the high voltage applied thereto.

Of the high voltage semiconductor devices, since an Lateral Diffused MOS (LDMOS) which is an MOS for the high voltage has a channel region and a drain electrode isolated by a drift region disposed therebetween, and controlled by a gate electrode, the LDMOS has a suitable structure for the high voltage.

Figure 1:
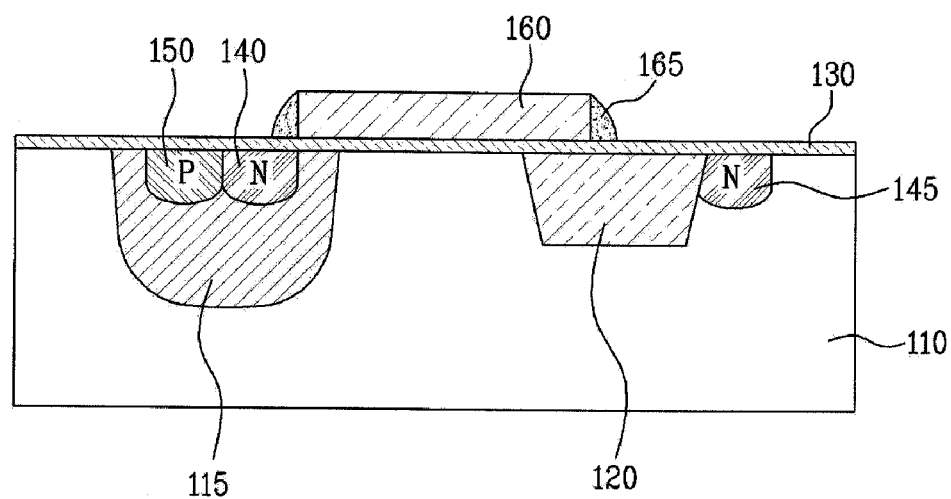

FIG. 1 illustrates a section of an LDMOS transistor.

As illustrated in FIG. 1, the LDMOS transistor is provided with high voltage N well 110, device isolation film 120, P type body 115, gate oxide film 130, first source region 140 and second source region 150, drain region 145, gate polysilicon 160 and spacers 165. Device isolation film 120, which is formed under gate polysilicon 160 of the LDMOS transistor, sustains an appropriate breakdown voltage BV. However, since current flows around device isolation film 120 to drain region 145, making a current path longer, a turn on resistance Ron characteristic becomes poor.

SUMMARY

Embodiments are related to a semiconductor device and a method for fabricating the same which shortens a current path for improving a resistance characteristic.

In accordance with embodiments, a semiconductor device can include at least one of the following: a high voltage first conduction type well in a semiconductor substrate, a second conduction type body in the high voltage first conduction type well, a source region in the second conduction type body, a trench in the high voltage first conduction type well, a first isolation oxide, an impurity doped polysilicon film, and a second isolation oxide stacked in the trench in succession, a drain region in the high voltage first conduction type well at one side of the trench, and a polygate on and/or over the high voltage first conduction type well.

In accordance with embodiments, a method for fabricating a semiconductor device can include at least one of the following: forming a second conduction type body in a semiconductor substrate by injecting impurities into a high voltage first conduction type well, forming a trench in the high voltage first conduction type well having the second conduction type body formed therein, forming a first isolation oxide, an impurity doped polysilicon film, and a second isolation oxide in the trench in succession, forming a gate oxide film and a polygate on and/or over the high voltage first conduction type well including the second isolation oxide, forming a source region in the second conduction type body, and then forming a drain region in the high voltage first conduction type well on one side of the trench.

In accordance with embodiments, a semiconductor device can include at least one of the following: a high voltage first conduction type well formed in a semiconductor substrate; a second conduction type body formed in the high voltage first conduction type well; a source region formed in the second conduction type body; a trench formed in the high voltage first conduction type well; a first isolation oxide, an impurity doped polysilicon film, and a second isolation oxide sequentially stacked in the trench; a drain region formed in the high voltage first conduction type well at one side of the trench; and a polygate formed over the high voltage first conduction type well.

In accordance with embodiments, a semiconductor device can include at least one of the following: a well region having a first conductive type; a body region having a second conductive type formed in the well region; a first impurity region having a first conductive type formed in the body region; a second impurity region having the second conductive type formed in the body region and in contact with the first impurity region; a trench formed in the well region; an insulating film formed over the entire bottom surface and a portion of the sidewalls of the trench; a first device isolation film formed in the trench and contacting the insulating film; a doped polysilicon film formed in the trench and contacting the insulating film and the first device isolation film; a second device isolation film formed in the trench and contacting the doped polysilicon film; a gate oxide film formed over and contacting the well region, the body region, the first, second and third impurity regions and the second device isolation film; a polygate formed over the gate oxide film; and a third impurity region having a first conductive type formed in the well region and spaced from the first and second impurity regions.

In accordance with embodiments, a method for fabricating a semiconductor device can include at least one of the following: forming a second conduction type body by injecting impurities into a high voltage first conduction type well in a semiconductor substrate; forming a trench in the high voltage first conduction type well having the second conduction type body formed therein; sequentially forming a first isolation oxide, an impurity doped polysilicon film, and a second isolation oxide in the trench; forming a gate oxide film and a polygate over the high voltage first conduction type well including the second isolation oxide; forming a source region in the second conduction type body; and then forming a drain region in the high voltage first conduction type well at one side of the trench

DRAWINGS

FIG. 1 illustrates an LDMOS transistor.

Example FIGS. 2A to 2G illustrate a method for fabricating an LDMOS transistor in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

Example FIGS. 2A to 2G illustrate sections showing a method for fabricating an LDMOS transistor in accordance with embodiments.

Figure 2A:
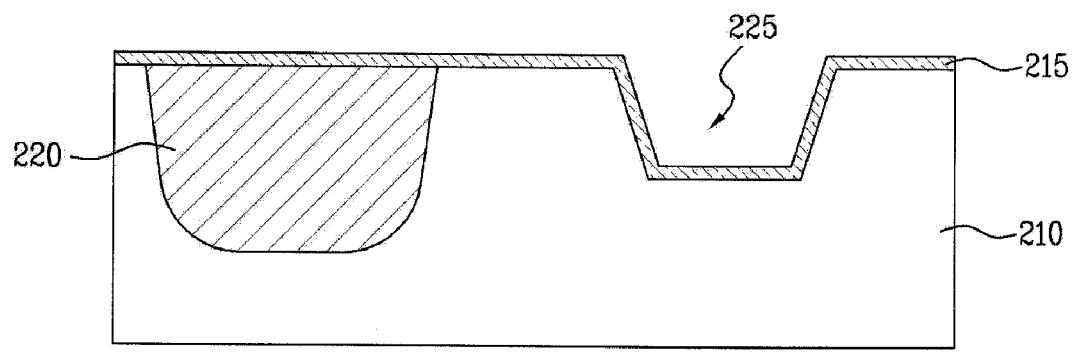

As illustrated in example FIG. 2A, N type impurity ions are injected into a semiconductor substrate to form high voltage N well 210. P type impurity ions are injected into one region of high voltage N well 210 to form P type body 220. Then, trench 225 is formed in the semiconductor substrate having high voltage N well 210 formed therein for forming a device isolation film. In detail, a photoresist pattern is formed which exposes the other region of high voltage N well 210, and the exposed region is etched using the photoresist pattern as a mask to form trench 225. The photoresist pattern is then removed. Trench 225 is formed deeper than the trench illustrated in FIG. 1. This is for securing the characteristic of the breakdown voltage BV. Liner oxide film 215 is then formed on and/or over an entire surface of high voltage N well 210 including trench 225.

Figure 2B:
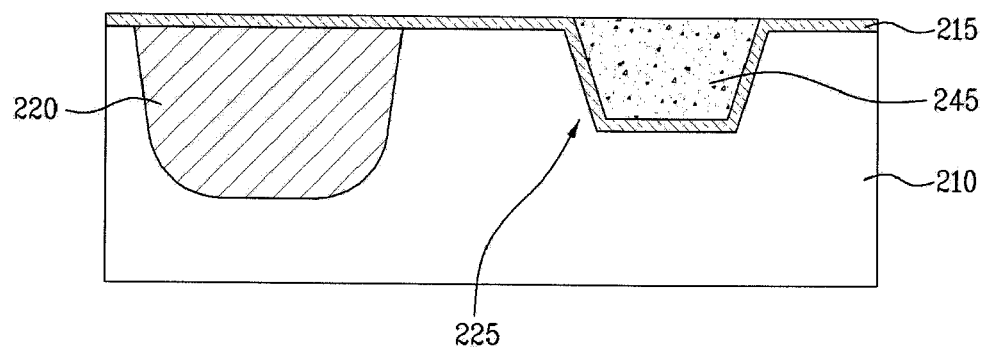

As illustrated in example FIG. 2B, a device isolation film is formed by gap filling first isolation oxide 245 in trench 225 having liner oxide film 215 formed thereon and/or thereover and then flattened by Chemical Mechanical Polishing (CMP).

Figure 2C:
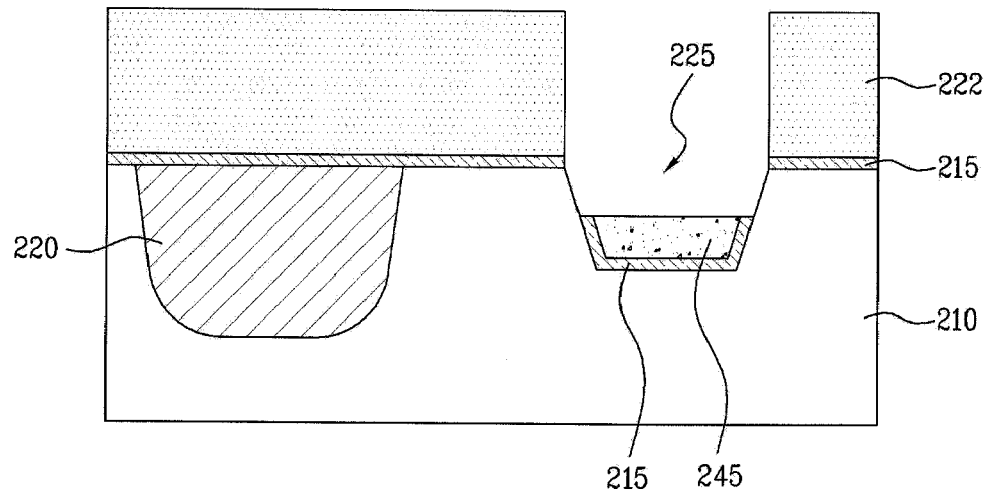

As illustrated in example FIG. 2C, a photoresist material is deposited on and/or over high voltage N well 210 including the device isolation film having first isolation oxide 245 gap filled therein, and subjected to photo and etching by using a mask to form photoresist pattern 222 which exposes the device isolation film. First isolation oxide 245 of the device isolation film is etched by using photoresist pattern 222 as a mask, leaving a thickness of first isolation oxide 245 in trench 225. At the etching, liner oxide film 215 on and/or over sidewalls of trench 225 is also removed. Photoresist pattern 222 left after the etching is removed by ashing or the like.

Figure 2D:
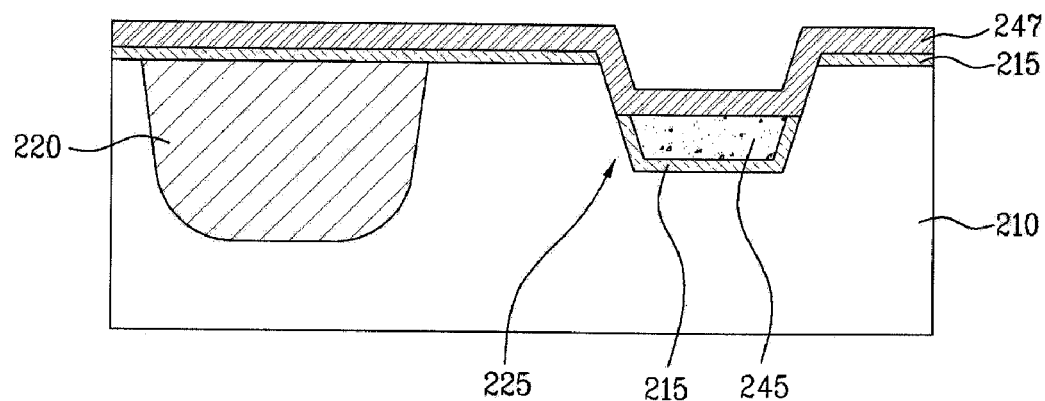

As illustrated in example FIG. 2D, n-doped polysilicon layer 247 is formed on and/or over high voltage N well 210 having a thickness of the oxide left in trench 225.

Figure 2E:
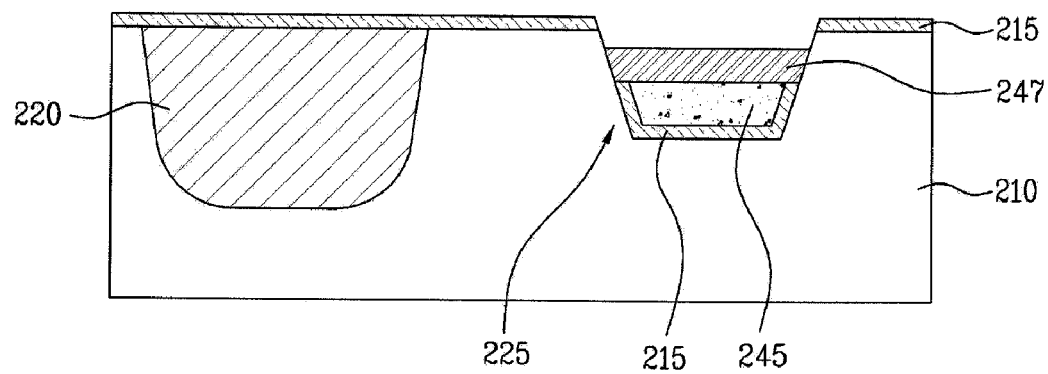

As illustrated in example FIG. 2E, n-doped polysilicon layer 247 formed on and/or over high voltage N well 210 is subjected to photo-lithography for patterning n-doped polysilicon layer 247 by photo and etching, to leave n-doped polysilicon layer 247 only on and/or over first isolation oxide 245. Having n-doped polysilicon layer 247 in trench 225 shortens a current path at the time of device operation, thereby reducing a device resistance, and improves a turn on resistance Ron characteristic, accordingly. First isolation oxide 245 formed under n-doped polysilicon layer 247 spreads an electric field when the device is turned on, thereby improving a breakdown voltage BV characteristic.

Figure 2F:
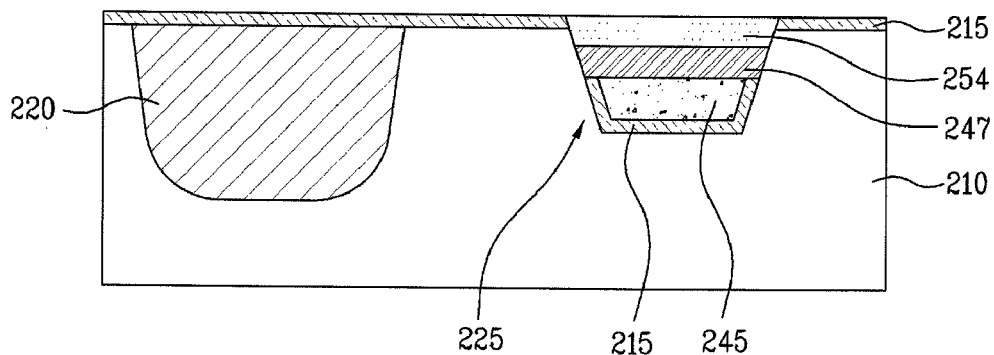

As illustrated in example FIG. 2F, second isolation oxide 254 is formed on and/or over n-doped polysilicon layer 247 in trench 225 and then flattened by CMP. Liner oxide film 215 is then removed from an entire surface of high voltage N well 210.

Figure 2G:
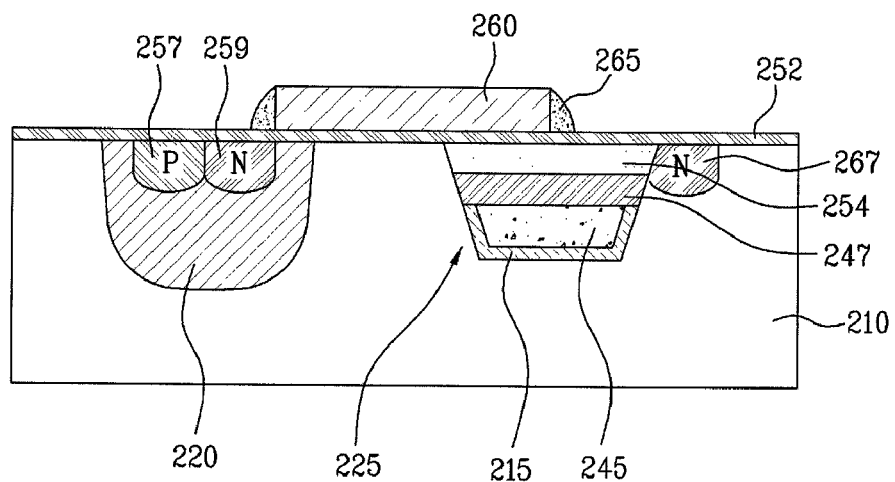

As illustrated in example FIG. 2G, gate oxide film 252 is formed on and/or over an entire surface of high voltage N well 210 having liner oxide film 215 removed therefrom, and polygate 260 is formed thereon and/or thereover. Polygate 260 is formed to overlap with a portion of P type body 220 and a portion of second isolation oxide 254 in trench 225. N type impurity ions are injected into P type body 220 using a mask to form N type impurity region 259. P type impurity ions are injected into P type body 220 using a mask to form P type impurity region 257 to be in contact with the N type impurity ions, thereby forming first source region 257 and second source region 259. N type impurity ions are injected into one side of trench 225 in high voltage N well 210 to form drain region 267. Spacers 265 are formed on and/or over opposite sides of polygate 260.

As has been described, the semiconductor device and the method for fabricating the same in accordance with embodiments have the following advantages.

Use of n-doped polysilicon layer 247 in trench 225 enables the current to flow to drain region 267, not around the device isolation film, but directly through trench 225. This shortens the current path at the time of device operation, thereby reducing a device resistance and improving the turn on resistance Ron, accordingly. The first isolation oxide 245 and second isolation oxide 254 formed on and/or over an upper and lower sides of n-doped polysilicon layer 247 serve to spread an electric field when the device is turn on, thereby enhancing the breakdown voltage BV.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a high voltage first conduction type well formed in a semiconductor substrate;
   a second conduction type body formed in the high voltage first conduction type well;
   a source region formed in the second conduction type body;
   a trench formed in the high voltage first conduction type well;
   a first isolation oxide, an impurity doped polysilicon film, and a second isolation oxide sequentially stacked in the trench;
   a drain region formed in the high voltage first conduction type well at one side of the trench; and
   a polygate formed over the high voltage first conduction type well.

2. The apparatus of claim 1, wherein the polygate overlaps the second conduction type body and the second isolation oxide in the trench between the second conduction type body and the trench.

3. The apparatus of claim 1, wherein the impurity doped polysilicon film comprises an N type impurity doped polysilicon film.

4. The apparatus of claim 1, wherein the source region comprises first and second conduction type impurity regions.

5. The apparatus of claim 4, wherein the first and second conduction type impurity regions are in contact with each other.

6. The apparatus of claim 1, wherein the drain region comprises a first conduction type impurity region.

7. A method comprising:
   forming a second conduction type body by injecting impurities into a high voltage first conduction type well in a semiconductor substrate;
   forming a trench in the high voltage first conduction type well having the second conduction type body formed therein;
   sequentially forming a first isolation oxide, an impurity doped polysilicon film, and a second isolation oxide in the trench;

sequentially forming a gate oxide film and a polygate over the high voltage first conduction type well including the second isolation oxide;

forming a source region in the second conduction type body; and then forming a drain region in the high voltage first conduction type well at one side of the trench.

8. The method of claim 7, wherein sequentially forming the gate oxide film and the polygate comprises:

forming the polygate to overlap the second conduction type body and the second isolation oxide in the trench between the second conduction type body and the trench.

9. The method of claim 7, wherein the impurity doped polysilicon film comprises an N type impurity doped polysilicon film.

10. The method of claim 7, wherein the source region comprises first and second conduction type impurity regions.

11. The method of claim 10, wherein the first and second conduction type impurity regions are in contact with each other.

12. The method of claim 9, wherein the drain region comprises a first conduction type impurity region.

13. An apparatus comprising:

a well region having a first conductive type;

a body region having a second conductive type formed in the well region;

a first impurity region having a first conductive type formed in the body region;

a second impurity region having the second conductive type formed in the body region and in contact with the first impurity region;

a trench formed in the well region;

an insulating film formed over the entire bottom surface and a portion of the sidewalls of the trench;

a first device isolation film formed in the trench and contacting the insulating film;

a doped polysilicon film formed in the trench and contacting the insulating film and the first device isolation film;

a second device isolation film formed in the trench and contacting the doped polysilicon film;

a gate oxide film formed over and contacting the well region, the body region, the first, second and third impurity regions and the second device isolation film;

a polygate formed over the gate oxide film; and a third impurity region having a first conductive type formed in the well region and spaced from the first and second impurity regions.

14. The apparatus of claim 13, wherein the first conductive type is an N type and the second conductive type is a P-type.

15. The apparatus of claim 14, wherein the first impurity region comprises a first source region, the second impurity region comprises a second source region and the third impurity region comprises a drain region.

16. The apparatus of claim 13, wherein the first impurity region comprises a first source region, the second impurity region comprises a second source region and the third impurity region comprises a drain region.

17. The apparatus of claim 13, wherein the well region comprises a high voltage well region.

18. The apparatus of claim 1, wherein the doped polysilicon film comprises an N type impurity doped polysilicon film.

19. The apparatus of claim 13, further comprising spacers formed over sidewalls of the polygate.

20. The apparatus of claim 13, wherein the polygate overlaps the body region and the second device isolation film.

* * * * *